(12) United States Patent
Stadlmair et al.

(10) Patent No.: US 11,340,639 B2
(45) Date of Patent: May 24, 2022

(54) LEAKAGE COMPENSATION CIRCUIT FOR A CAPACITIVE OR RESISTIVE MEASUREMENT DEVICE

(71) Applicant: NXP B.V., Eindhoven (NL)

(72) Inventors: Rainer Stadlmair, Deutschfeistritz (AT); Slawomir Rafal Malinowski, Graz (AT)

(73) Assignee: NXP B.V., Eindhoven (NL)

( * ) Notice: Subject to any disclaimer, the term of this patent is extended or adjusted under 35 U.S.C. 154(b) by 79 days.

(21) Appl. No.: 17/089,871

(22) Filed: Nov. 5, 2020

(65) Prior Publication Data

US 2021/0173418 A1 Jun. 10, 2021

(30) Foreign Application Priority Data

Dec. 4, 2019 (EP) .................................... 19213540

(51) Int. Cl.
*G05F 1/44* (2006.01)
*G01R 27/14* (2006.01)
(Continued)

(52) U.S. Cl.
CPC .............. *G05F 1/44* (2013.01); *G01R 27/14* (2013.01); *G01R 27/2605* (2013.01); *G01R 31/001* (2013.01); *G01R 31/3004* (2013.01)

(58) Field of Classification Search
CPC ..... G05F 1/44; G05F 3/00; G05F 3/02; G05F 3/30; G01R 27/14; G01R 27/26;
(Continued)

(56) References Cited

U.S. PATENT DOCUMENTS 6,556,408 B1 4/2003 Zhang
6,667,650 B2 12/2003 Gammie et al.
(Continued)

FOREIGN PATENT DOCUMENTS

DE 102015203866 A1 * 9/2016

OTHER PUBLICATIONS

Lee, I-Ting et al; "A Leakage-Current-Recycling Phase-Locked Loop in 65 nm CMOS Technology;" IEEE Journal of Solid-State Circuits, vol. 47, Issue 11, Nov. 2012; DOI: 10.1109/JSSC.2012.2209810.

*Primary Examiner* — Son T Le

(57) ABSTRACT

It is described a leakage compensation circuit for a measurement device which comprises a measurement circuit with a leaking device that is connected to a measurement path and causes a leakage current. The leakage compensation circuit comprises: i) a replica device of the leaking device, wherein the replica device is connected to a replica path, and wherein the replica device is configured to cause a replica leakage current that is essentially equal to the leakage current of the leaking device, ii) a voltage regulator which is connected to the measurement path and to the replica path, wherein the voltage regulator is configured to regulate the voltage in the replica path based on the voltage of the measurement path, and iii) a current mirror which is connected to the measurement path and to the replica path, wherein the current mirror is configured to mirror the replica leakage current of the replica device into the measurement path.

17 Claims, 1 Drawing Sheet

(51) Int. Cl.
  *G01R 27/26* (2006.01)
  *G01R 31/00* (2006.01)
  *G01R 31/30* (2006.01)

(58) Field of Classification Search
  CPC .. G01R 27/2605; G01R 31/00; G01R 31/001; G01R 31/30; G01R 31/3004; G01R 27/025; G01R 15/00; G01R 31/50; G01R 31/52; G01R 31/28; G01R 27/02
  See application file for complete search history.

(56) References Cited

U.S. PATENT DOCUMENTS

| | | |
|---|---|---|
| 7,256,621 B2 | 8/2007 | Lih et al. |
| 7,642,814 B2 | 1/2010 | Hu |
| 9,163,954 B2 | 10/2015 | Cheong et al. |
| 2005/0110535 A1 | 5/2005 | Bernstein et al. |
| 2013/0229213 A1* | 9/2013 | Park ............... H03L 7/093 |
| | | 327/157 |
| 2016/0377745 A1* | 12/2016 | Daerr ............... G01T 1/247 |
| | | 250/371 |

* cited by examiner

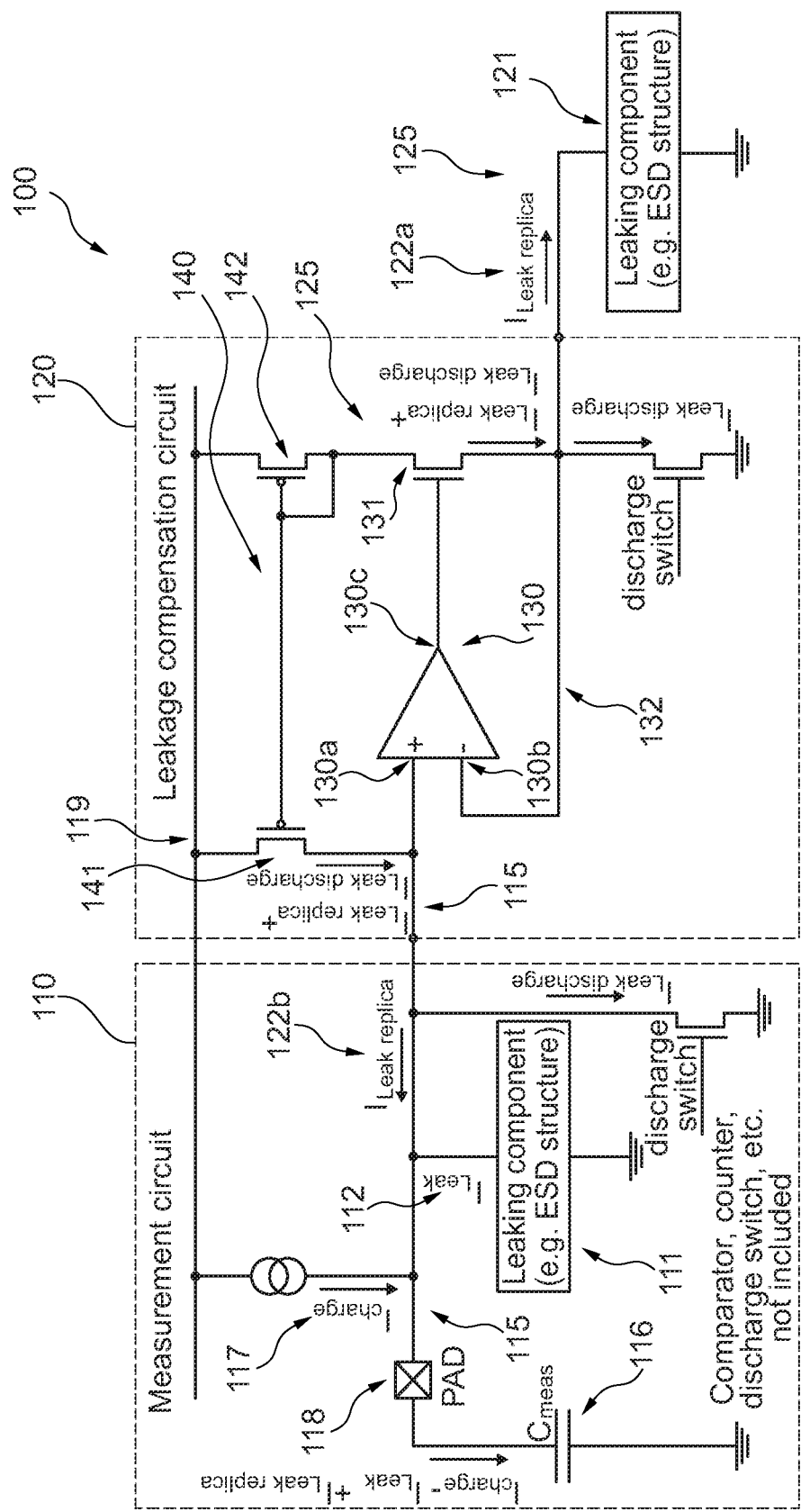

LEAKAGE COMPENSATION CIRCUIT FOR A CAPACITIVE OR RESISTIVE MEASUREMENT DEVICE

CROSS-REFERENCE TO RELATED APPLICATIONS

This application claims priority under 35 U.S.C. § 119 to European Patent Application No. 19213540.8, filed on Dec. 4, 2019, the contents of which are incorporated by reference herein.

FIELD OF THE INVENTION

The invention relates to a leakage compensation circuit for a measurement device. The invention further relates to the measurement device. Furthermore, the invention relates to a tamper sensor that comprises the measurement device. The invention also relates to a method for compensating leakage in a measurement device. The invention may relate to the technical field of capacitive or resistive measurement devices, in particular to a leakage compensation in these devices.

BACKGROUND OF THE INVENTION

Measurements that use a measurement current to generate a voltage that will be measured, are susceptible to leakage currents since they can falsify the measurement results, if they make up a significant amount of the measurement current. For example, capacitive or resistive measurements that use small measurement currents in order to measure the capacitance or resistance (of a device to be tested) connected to an external pad of a measurement device, suffer from non-linearities due to leakage of various components (e.g. electrostatic discharge (ESD) protections). Such leakage is highly dependent on the voltage level and can thus significantly impact the measurement by either reducing the measurement voltage (resistive measurement) or increasing the time till a certain voltage level is reached (e.g. capacitive measurement). This makes the voltage behavior non-linear and falsifies the measurement outcome.

OBJECT AND SUMMARY OF THE INVENTION

It is an object of the invention to provide an accurate and reliable capacitive or resistive measurement device.

In order to achieve the object defined above, a method and a communication system according to the independent claims are provided.

According to an aspect of the invention, a leakage compensation circuit for a (capacitive or resistive) measurement device is described. The measurement device comprises a measurement circuit with a leaking device that is connected to a measurement path and causes a leakage current (in the measurement path). The leakage compensation circuit comprises: i) a replica device of the leaking device (in particular an identical replica), wherein the replica device is connected to a replica path, and wherein the replica device is configured to cause a replica leakage current (in the replica path) that is (essentially) equal to the leakage current of the leaking device, ii) a voltage regulator which is connected/connectable to the measurement path and to the replica path, wherein the voltage regulator is configured to regulate the voltage in the replica path based on the voltage of the measurement path (in particular adapt the voltage of the replica path to the voltage of the measurement path), and iii) a current mirror which is connected/connectable to the measurement path and to the replica path, wherein the current mirror is configured to mirror the replica leakage current of the replica device (in the replica path) into the measurement path.

According to a further aspect of the invention, a measurement device is described, which comprises: i) a measurement circuit which comprises: a) a measurement path, and b) a leaking device that is connected to the measurement path and causes a leakage current, and ii) the leakage compensation circuit as described above.

According to a further aspect of the invention, a tamper sensor is described that is configured to sense if a closure (e.g. of a device) has been tampered with or not, wherein the tamper sensor comprises the measurement device as described above. For example, an RFID chip may, with improved measurement accuracy, detect if a closure has been tampered with (especially over temperature range).

According to a further aspect of the invention a method for compensating a leakage in a measurement device is described. The measurement device comprises a measurement circuit with a leaking device that is connected to a measurement path and causes a leakage current. The method comprises: i) providing a replica device of the leaking device, wherein the replica device is connected to a replica path, ii) causing (by the replica device) a replica leakage current that is essentially equal to the leakage current of the leaking device, iii) regulating (by a voltage regulator which is connected to the measurement path and to the replica path) the voltage in the replica path based on the voltage of the measurement path, and iv) mirroring (by a current mirror which is connected to the measurement path and to the replica path) the leakage current of the replica device into the measurement path.

According to an exemplary embodiment, the invention may be based on the idea that an especially accurate and reliable capacitive or resistive measurement device can be provided, when a specific leakage compensation circuit (that compensates the internally introduced leakage current) is applied in the measurement device (besides a measurement circuit). The specific leakage compensation circuit comprises i) a replica device (replica device(s) of the component(s) that cause the leakage in the measurement path), ii) a voltage regulator (that regulates the voltage in the replica path to the same level as in the measurement path) and iii) a current mirror (mirroring the leakage current of the replica path into the measurement path), which provide in the described favorable combination a surprisingly efficient and accurate leakage compensation. In this manner, the accuracy and reliability of measurement results can be increased, for example a capacitive or resistive measurement, where the device to be measured is connected to the measurement device via a test pad (the test pad itself may need to be ESD protected which can be a major cause for the leakage).

According to an embodiment, the leakage compensation circuit is configured to mirror the leakage current into in the measurement path in order to compensate the (current) loss caused by the leakage current. This may provide the advantage that current loss (and corresponding measurement errors) can be efficiently compensated.

According to a further embodiment, the voltage regulator comprises an amplifier, in particular an error-amplifier (e.g. an operational amplifier), more in particular with a feedback loop (e.g. with a regulator transistor, thereby forming a low dropout (LDO) regulator). This may provide the advantage that the voltage regulation can be implemented in an efficient manner with established industry components.

In the context of this document, the term "voltage regulator" may refer to any device(s) that is/are suitable to regulate a voltage (e.g. a replica path voltage) based on another voltage (e.g. a measurement voltage). In an example, a voltage regulator may be realized by an LDO (low dropout) regulator. In another example, a voltage regulator may be realized by an operational amplifier (in feedback configuration). The voltage regulator may be fast enough to follow any voltage change of a measurement circuit.

According to a further embodiment, the amplifier comprises: i) a first input (in particular a positive input) connected to the measurement path, ii) a second input (in particular a negative input) connected to replica path as a feedback path, and iii) an output connected to the replica path via a regulator component (in particular a regulator transistor).

According to a further embodiment, the regulator component is connected in the replica path between the current mirror and the replica device.

According to a further embodiment, the current mirror comprises two (or more) field-effect transistors. These are in particular MOS-FETs (metal-oxide-semiconductor field-effect transistor).

According to a further embodiment, the current mirror is configured to be operational beyond the measurement range of the measurement circuit. In particular the current mirror comprises a (optional) charge pump. The charge pump may be needed in case of low supply voltage levels. In this case, the supply voltage may be increased (by the charge pump) to ensure operation over the full measurement voltage range.

According to a further embodiment, the measurement circuit further comprises: i) a measurement component (in particular a measurement capacitor or a measurement resistor) that is connected in the measurement path, and ii) a current source that is connected to the measurement path and is configured to supply electric energy (via the measurement path) to the measurement component (e.g. by charging the capacitor).

According to a further embodiment, the measurement circuit further comprises: a connection element (in particular a (external) test pad) that is configured to be connected to a device to be measured. In particular, the connection element is connected in the measurement path between the current source and the measurement component.

According to a further embodiment, the connection element is further electrically connected (in particular via the measurement path) to the leaking device.

According to a further embodiment, the leaking device is an electronic component, for example an electrostatic discharge device (ESD device).

The aspects defined above and further aspects of the invention are apparent from the examples of embodiment to be described hereinafter and are explained with reference to these examples of embodiment. The invention will be described in more detail hereinafter with reference to examples of embodiment but to which the invention is not limited.

BRIEF DESCRIPTION OF THE DRAWINGS

FIG. 1 illustrates a measurement device according to an exemplary embodiment of the invention.

The illustrations in the drawings are schematic. In different drawings, similar or identical elements are provided with the same reference signs.

DESCRIPTION OF EMBODIMENTS

Before, referring to the drawings, exemplary embodiments will be described in further detail, some basic considerations will be summarized based on which exemplary embodiments of the invention have been developed.

According to an exemplary embodiment of the invention, capacitive or resistive measurement methods can employ small currents during the measurement, especially when small capacitors or high resistors are to be measured. Such small currents however might significantly be impacted by leakage of certain components attached to the measurement circuit. A leakage compensation circuit can be used, that employs replica devices and a regulator regulating the voltage level on the replica devices to the same voltage as on the measurement path. Furthermore, a current mirror is used to mirror the leakage of the replica devices into the measurement path and by that compensates leakage introduced non-linearities of the measurement. In other words, the measurement uses a combination of replica devices, voltage regulator and current mirror, while in the prior art the current is directly adjusted till the voltage levels of the node, that shall be compensated, and the replica device are the same.

According to an exemplary embodiment of the invention, in order to compensate for the leakage introduced by certain components, an identical replica of the leaking components is needed. This replica circuit must be exposed to the exact same conditions as the measurement circuit, to show the same leakage behavior (same temperature gradient, same current direction, same environment and same voltage levels). Since the leakage is highly voltage dependent a regulator is needed, that will ensure the replica devices see the same voltage level as the measurement circuit. The regulator needs to be fast enough to follow any voltage changes of the measurement circuit. A further component needed is a current mirror that will mirror the leakage current of the replica devices into the measurement circuit and by that compensates the current loss in the structures attached to the measurement circuit (e.g. ESD circuits, etc.). Preferably, the current mirror needs to be operational beyond the measurement range of the measurement circuit, e.g. by applying a charge pump.

FIG. 1 shows a measurement device 100 according to an exemplary embodiment of the invention. The measurement device 100 comprises a measurement circuit 110 and a leakage compensation circuit 120. The measurement circuit 110 comprises a measurement component which is in the example shown a measurement capacitor 116. A current source 117 is configured to supply electric energy and thereby charge ($I_{charge}$) the measurement capacitor 116 via a measurement path 115. The measurement circuit 100 further comprises a test pad 118 (connection element) that can be connected to a device to be measured. The test pad 118 is connected in the measurement path 115 between the current source 117 and the measurement capacitor 116. Furthermore, the test pad 118 is electrically connected via the measurement path 115 to an electrostatic discharge device (ESD device) 111 (which is hence also connected to the measurement path 115). This is because the test pad needs to be ESD protected. The ESD device is hereby a leaking device 111 that causes a leakage current 112 ($I_{leak}$) which is a major cause of current leakage. Leakage introduces non-linearities (e.g. in the voltage behavior) and thus falsifies the measurement outcome.

In order to overcome this issue, the measurement device 100 comprises further the leakage compensation circuit 120. The leakage compensation circuit 120 comprises a replica device 121 of the leaking device 111, wherein the replica device 121 is connected to a replica path 125. The replica device 112 is an identical replica of the leaking device 111 and is exposed to the same conditions to show the same leakage behavior (same temperature gradient, same current direction, same environment, and same voltage levels). Thus, the replica device 121 is configured to cause a replica leakage current 122$a$ ($I_{leak\ replica}$) (in the replica path 125) that is (essentially) equal to the leakage current 112 of the leaking device 111. The replica path 125 is arranged between a common current line 119 and the replica device 121 (in between is connected a current mirror 140 and a regulator transistor 131). From the common current line 119, along the replica path 125, the replica leakage current 122$a$ is caused. The current mirror 140 comprises a first field-effect transistor 141 and a second field-effect transistor 142 (in particular MOS-FETs). The first field effect transistor 141 is connected to the common current line 119 and the measurement path 115. The second field effect transistor 142 is connected to the common current line 119 and, via the replica path 125, to the replica device 121. The current mirror 140 is configured to mirror the replica leakage current 122$a$ (in the replica path 125) of the replica device 121 (second transistor 142 side) into the measurement path 115 (first transistor 141 side) as replica leakage current 122$b$. The replica leakage current 122$b$ is hereby mirrored into in the measurement path 115 to compensate the loss caused by the leakage current 112 ($I_{charge} - I_{leak} + I_{leak\ replica}$).

The leakage compensation circuit 120 further comprises a voltage regulator 130 which is connected between the measurement path 115 and the replica path 125. The voltage regulator 130 is configured to regulate the voltage in the replica path 125 based on the voltage of the measurement path 115. In particular, the voltage regulator 130 is implemented as an error-amplifier 130 together with the regulator transistor 131 that adapts/regulates the voltage in the replica path 125 to the voltage of the measurement path 115. The error amplifier 130 comprises an (operational) amplifier which comprises: a first (positive) input 130$a$ connected to the measurement path 115, a second (negative) input 130$b$ connected to the replica path 125 (via a feedback path 132), and an output 130$c$ connected to the replica path 125 via the regulator transistor 131. The error-amplifier 130 forms together with the regulator transistor 131 a low dropout (LDO) regulator. The regulator transistor 131 is connected in the replica path 125 between the current mirror 140 (second transistor 142) and the replica device 121.

In other words, with respect to the measurement circuit 110, the measurement principle is depicted: a capacitor 116 is charged via a constant current 117, and leakage 112 will impact the measurement. Regarding the leakage compensation circuit 120, it is depicted how the replica leakage 122 is generated and mirrored into the measurement circuit 110.

REFERENCE NUMERALS

100 Measurement device
110 Measurement circuit
111 Leaking device
112 Leakage current
115 Measurement path
116 Measurement component, capacitor
117 Current source
118 Pad, connection element for device to be tested
119 Common current line
120 Leakage compensation circuit
121 Replica device
122$a$ Replica leakage current in replica path
122$b$ Replica leakage current in measurement path (mirrored)
125 Replica path
130 Voltage regulator, error-amplifier
130$a$ First input
130$b$ Second input
130$c$ Output
131 Regulator component, transistor
132 Feedback line
140 Current mirror
141 First transistor
142 Second transistor

The invention claimed is:

1. A leakage compensation circuit for a measurement device which comprises a measurement circuit with a leaking device that is connected to a measurement path and causes a leakage current, the leakage compensation circuit comprising:
   a replica device of the leaking device, wherein the replica device is connected to a replica path, and wherein the replica device is configured to cause a replica leakage current that is essentially equal to the leakage current of the leaking device;
   a voltage regulator which is connected to the measurement path and to the replica path, wherein the voltage regulator is configured to regulate the voltage in the replica path based on the voltage of the measurement path; and
   a current mirror which is connected to the measurement path and to the replica path, wherein the current mirror is configured to mirror the replica leakage current of the replica device into the measurement path.

2. The leakage compensation circuit according to claim 1, wherein the leakage compensation circuit is configured so that the leakage current mirrored into the measurement path compensates for the loss caused by the leakage current.

3. The leakage compensation circuit according to claim 1, wherein the voltage regulator comprises an amplifier.

4. The leakage compensation circuit according to claim 3, wherein the amplifier is an error-amplifier.

5. The leakage compensation circuit according to claim 3, wherein the amplifier comprises:
   a first input connected to the measurement path;
   a second input connected to the replica path as a feedback path; and
   an output connected to the replica path via a regulator component.

6. The leakage compensation circuit according to claim 5, wherein the regulator component is connected in the replica path between the current mirror and the replica device.

7. The leakage compensation circuit according to claim 1, wherein the current mirror comprises two field-effect transistors.

8. The leakage compensation circuit according to claim 1, wherein the current mirror is configured to be operational beyond the measurement range of the measurement circuit.

9. The leakage compensation circuit according to claim 8, wherein the current mirror comprises a charge pump.

10. A measurement device, comprising:
    a measurement circuit that comprises:
       a measurement path, and
       a leaking device that is connected to the measurement path and causes a leakage current; and
    a leakage compensation circuit that is connected to the measurement path, the leakage compensation circuit comprising:

a replica device of the leaking device, wherein the replica device is connected to a replica path, and wherein the replica device is configured to cause a replica leakage current that is essentially equal to the leakage current of the leaking device;

a voltage regulator which is connected to the measurement path and to the replica path, wherein the voltage regulator is configured to regulate the voltage in the replica path based on the voltage of the measurement path; and a current mirror which is connected to the measurement path and to the replica path, wherein the current mirror is configured to mirror the replica leakage current of the replica device into the measurement path.

11. The measurement device according to claim 10, wherein the measurement circuit further comprises:

a measurement component; and a current source that is connected to the measurement path and is configured to supply electric energy via the measurement path to the measurement component.

12. The measurement device according to claim 11, wherein the measurement component is a measurement capacitor or a measurement resistor that is connected in the measurement path.

13. The measurement device according to claim 10, wherein the measurement circuit further comprises:

a connection element that is configured to be connected to a device to be measured, wherein the connection element is connected in the measurement path between the current source and the measurement component.

14. The measurement device according to claim 13, wherein the connection element is further electrically connected via the measurement path to the leaking device.

15. The measurement device according to claim 10, wherein the leaking device is an electronic component.

16. The measurement device according to claim 15, wherein the electronic component is an electrostatic discharge device (ESD) device.

17. A method for compensating a leakage in a measurement device which comprises a measurement circuit with a leaking device that is connected to a measurement path and causes a leakage current, the method comprising:

providing a replica device of the leaking device, wherein the replica device is connected to a replica path;

causing, by the replica device, a replica leakage current that is essentially equal to the leakage current of the leaking device;

regulating, by a voltage regulator which is connected to the measurement path and to the replica path, the voltage in the replica path based on the voltage of the measurement path; and mirroring, by a current mirror which is connected to the measurement path and to the replica path, the leakage current of the replica device into the measurement path.

* * * * *